US012756909B2

(12) United States Patent
Shaw

(10) Patent No.: US 12,756,909 B2
(45) Date of Patent: Oct. 6, 2026

(54) CAMERA WITH A SEALING BETWEEN A CIRCUIT BOARD AND A LENS MODULE FOR A MOTOR VEHICLE

(71) Applicant: CONNAUGHT ELECTRONICS Ltd., Tuam (IE)

(72) Inventor: Mark Shaw, Tuam (IE)

(73) Assignee: CONNAUGHT ELECTRONICS Ltd., Tuam (IE)

( * ) Notice: Subject to any disclaimer, the term of this patent is extended or adjusted under 35 U.S.C. 154(b) by 327 days.

(21) Appl. No.: 18/530,225

(22) Filed: Dec. 6, 2023

(65) Prior Publication Data

US 2024/0187713 A1 Jun. 6, 2024

(30) Foreign Application Priority Data

Dec. 6, 2022 (DE) ........................ 102022132338.2

(51) Int. Cl.
*G03B 17/00* (2021.01)
*H04N 23/51* (2023.01)
*H05K 5/06* (2006.01)

(52) U.S. Cl.
CPC ............... *H04N 23/51* (2023.01); *H05K 5/06* (2013.01)

(58) Field of Classification Search
CPC ........ G03B 17/08; G03B 30/00; G03B 17/00; G03B 17/02; G03B 17/12; G03B 17/55; H04N 23/51; H04N 23/50; H05K 5/06; B60R 1/20; B60R 11/04
See application file for complete search history.

(56) References Cited

U.S. PATENT DOCUMENTS 9,751,155 B2 * 9/2017 Wang .................... H04N 23/51
11,052,833 B2 7/2021 Oba
(Continued)

FOREIGN PATENT DOCUMENTS

CN 113923320 A 1/2022
CN 114995019 A * 9/2022 ............ G03B 30/00
(Continued)

OTHER PUBLICATIONS

International Search Report issued in corresponding German Patent Application No. 10 2022 132 338.2 mailed Sep. 12, 2023 (6 pages).
(Continued)

*Primary Examiner* — Mustak Choudhury
(74) *Attorney, Agent, or Firm* — Osha Bergman Watanabe & Burton LLP

(57) ABSTRACT

The present invention relates to a camera for a motor vehicle. The camera includes a housing that delimits the boundary of a receiving space. A lens module of the camera and a circuit board of the camera are arranged in the receiving space. The circuit board and the lens module are arranged axially spaced apart from each other in the direction of the longitudinal axis of the camera so that between the circuit board and the lens module, a clearance is formed. Between the circuit board and the lens module, an elastic sealing is arranged so that the clearance is sealed, by the sealing, from the remaining volume space in the housing. The sealing includes a predetermined bending point where a width of the sealing is minimal to allow bending.

15 Claims, 4 Drawing Sheets

(56) References Cited

U.S. PATENT DOCUMENTS

Figure 1:
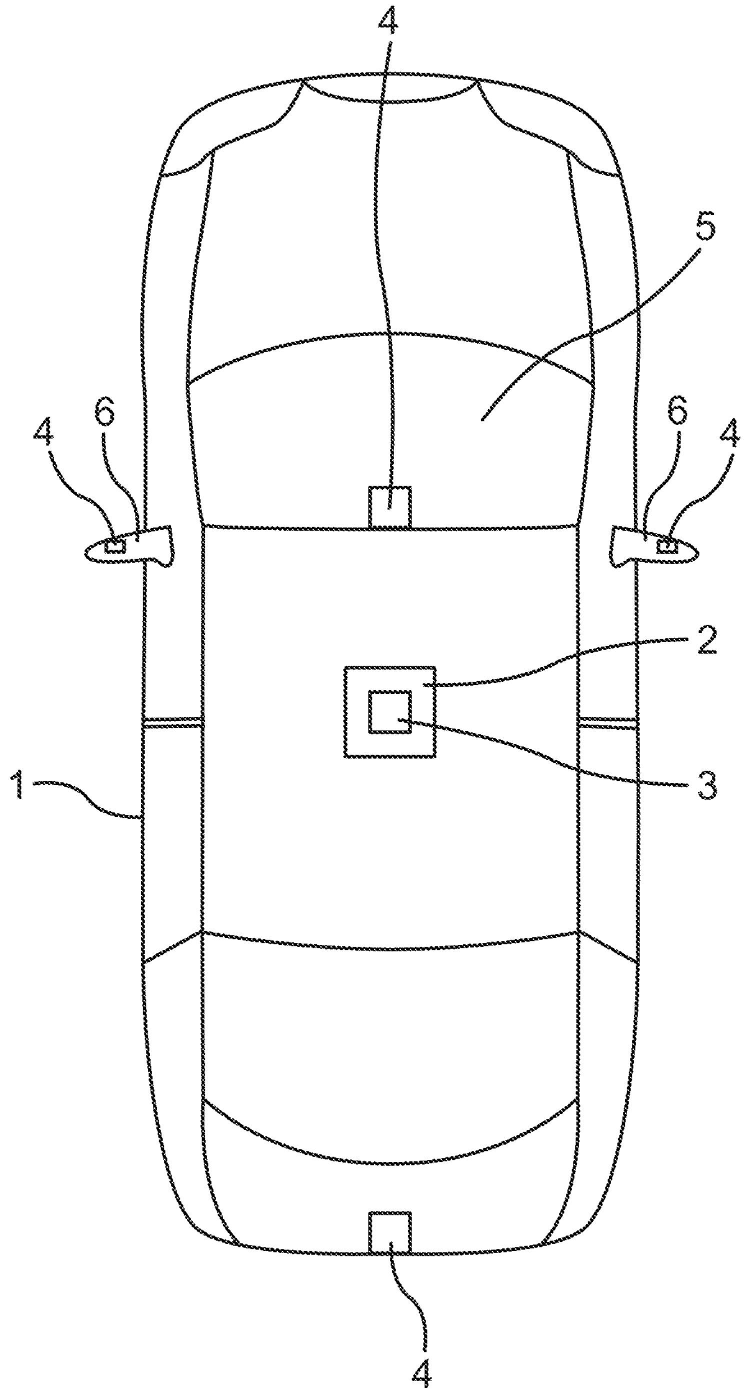

| | | | | |
|---|---|---|---|---|
| 2015/0181086 | A1* | 6/2015 | Pahlitzsch | H04N 23/52 348/374 |
| 2015/0365569 | A1* | 12/2015 | Mai | G03B 17/55 348/373 |
| 2017/0054882 | A1* | 2/2017 | Winter | G03B 17/08 |

FOREIGN PATENT DOCUMENTS

| | | | | |
|---|---|---|---|---|
| CN | 113923320 | B * | 12/2024 | H04N 23/51 |
| DE | 102021113716 | A1 | 12/2022 | |
| JP | 2020-112744 | A | 7/2020 | |
| WO | 2020/021984 | A1 | 1/2020 | |

OTHER PUBLICATIONS

Extended European Search Report issued in corresponding European Patent Application No. 23212202.8 mailed May 7, 2024 (7 pages).

* cited by examiner

CAMERA WITH A SEALING BETWEEN A CIRCUIT BOARD AND A LENS MODULE FOR A MOTOR VEHICLE

The invention relates to a camera for a motor vehicle as well as a motor vehicle with such a camera. The camera comprises a sealing, which is arranged between a circuit board and a lens module of the camera.

A motor vehicle may comprise at least one camera, which is for instance configured to capture an environment of the motor vehicle. The camera may for instance be arranged in such a way on the motor vehicle that it can capture the environment in a front area, a rear area, and/or a side area of the motor vehicle. Alternatively or additionally, the camera may capture an interior of the motor vehicle.

The camera of the motor vehicle is typically exposed to variations in temperature and/or environmental conditions. The variations in temperature are for instance due to weather, time of the day and/or season. The environmental conditions are for instance equally dependent on the weather and/or dependent on the environment. Due to the environmental conditions, the camera may for instance be exposed to water, snow, dust, sand, and/or mud. Therefore, the camera is sealed from the environment by a housing. However already during manufacturing of the camera, foreign object debris (FOD) may enter an interior of the camera in particular an area of an optical path within the camera. A manufacturing process that may produce FOD is, for example, laser soldering of a circuit board of the camera and/or laser welding of the camera housing. For a quality of a camera image generated by the camera it is advantageous if at least the area of the optical path within the camera is protected, in particular against the environmental conditions and/or FOD, since they may reduce the quality of the camera image. This area, which is located between a lens module and the circuit board, on which for instance a sensor is arranged, is therefore typically sealed by a sealing against for instance the remaining volume space within the camera.

The sealing is fastened by applying force and thus by compression between the lens module and the circuit board. The compression, however, may lead to increasing a predetermined distance between the lens module and the circuit board so that for instance the circuit board is moved too close to the lens module. Hereby the camera image may become blurred at least partially since for instance the sensor arranged on the circuit board was moved out of a focal area of the lens module. A typical sealing in the camera therefore does not facilitate a robust sealing of the area of the optical path.

Document US 2015/0181086 A1 shows an image collector device comprising a sealed sensor space, in which a sensor is arranged that is located between a lens and a printed circuit board. The image collector device comprises a sealing device for the sensor space, which comprises an elastic circumferentially extending wall section. The circumferentially extending wall section is arranged around the sensor and is configured to seal the sensor. It may be compressed between the lens and the printed circuit board.

It is the object of the invention to provide a solution by which a volume space between a circuit board and a lens module of a camera can be sealed in a robust manner.

The object is solved by the subject matters of the independent patent claims.

A first aspect of the invention relates to a camera for a motor vehicle. The camera may alternatively be referred to as camera device. The camera is for instance an external camera which is configured to capture an environment of the motor vehicle. The external camera is for instance a front camera, a rear camera, and/or a side camera of the motor vehicle. Alternatively or additionally, the camera may be an interior camera, which is configured to capture an interior of the motor vehicle.

The camera comprises a housing bounding a receiving space. By the housing the camera is spatially bounded. In the receiving space a lens module of the camera and a circuit board of the camera are arranged. The lens module may alternatively be referred to as a camera lens. The lens module is configured to capture light from an environment of the camera. At an end facing away from the environment light exits the lens module towards the circuit board. The circuit board comprises for instance at least one sensor, which is configured to capture light that hits it and to generate a camera image describing the environment of the camera. The circuit board may be configured as printed circuit board.

The circuit board and the lens module are arranged axially spaced apart from each other in the direction of a longitudinal axis of the camera so that between the circuit board and the lens module a clearance is formed. This clearance forms an area of an optical path between the lens module and the circuit board. Between the circuit board and the lens module an elastic sealing is arranged so that the clearance is sealed by the sealing from a remaining volume space in the housing.

The sealing comprises a predetermined bending point, at which a width of the sealing transverse to the longitudinal axis is minimal in comparison with the width of the sealing in regions of the sealing adjoining the predetermined bending point. This has the effect that the sealing in case of an axial compression is bent transverse to the longitudinal axis at the predetermined bending point. The predetermined bending point thus is an area of the sealing at which the same is narrower and thus has a smaller width than in the remaining areas of the sealing. At the predetermined bending point consequently a cross-sectional area of the sealing is reduced in comparison with the remaining sealing. The predetermined bending point may alternatively be referred to as defined bending point of the sealing. The predetermined bending point is on both sides surrounded by areas in which the sealing is wider than at the predetermined bending point when viewed in the direction of the longitudinal axis. The width of the sealing at the predetermined bending point amounts for instance to 0.5 millimeter. In comparison thereto the width of the sealing in the regions adjoining the predetermined bending point is for instance larger than 0.5 millimeter and smaller than 0.6 millimeter or in particular 0.7 millimeter. Designs that differ in terms of scale are possible.

The direction of the longitudinal axis corresponds to a height direction of the sealing so that its width direction is arranged transverse to the longitudinal axis. The width may for instance be oriented perpendicular to the longitudinal axis. The predetermined bending point is for instance arranged centrally or in an upper half of the sealing when viewed in the direction of the longitudinal axis, wherein the upper half is the part of the sealing that is arranged closer to the circuit board than to the lens module. In case of the axial compression for instance a force from above and/or below in the longitudinal direction is applied to the sealing. By the axial compression for instance the circuit board is pressed upon the sealing and same in turn upon the lens module. In case of the axial compression the sealing is at least partially compressed towards the longitudinal axis and thus in the axial direction, depending on how elastic a material of the sealing is.

Due to the minimal width of the sealing at the predetermined bending point, same forms the part of the sealing at which under the effect of force the sealing is deformed first. In this connection the respective area adjoining the predetermined bending point is bent for instance in a respective predetermined direction. Due to the fact that the predetermined bending point is a fixed point, the deformation of the sealing effected under the axial compression is predetermined or at least directed into a determined transverse direction relative to the longitudinal direction. This means that a bending direction is predetermined into which the sealing is reliably bent. By the fixed predetermination of the bending of the sealing under axial compression the clearance is sealed in a particularly robust way, since a predetermined distance between the circuit board and the lens module can be reliably observed by the sealing with the predetermined bending point. This means that an undesirable relative movement between the circuit board and the lens module is at least reduced. Thereby the quality of the camera image captured by the camera is kept constant. Furthermore, that the clearance is sealed in a particularly robust manner due to the sealing under axial compression effects that foreign object debris (FOD) that may enter the area of the optical path within the camera for example during manufacturing is at least reduced, in particular prevented. This as well contributes to good camera image quality.

An advantageous embodiment envisages that the sealing is a ring. The ring comprises in particular a diameter that is larger than or equal to a diameter of an opening of the lens module, which is arranged on the end of the lens module facing away from the environment, and/or to a diameter of the sensor on the circuit board. The sealing is arranged in the form of a ring around the opening or the sensor, respectively. The sealing thus is located outside a typical optical path through the clearance. An axis running through a center of the ring is arranged parallel to the longitudinal axis and in particular coincides with the longitudinal axis, in case same is configured as central axis of the camera. Due to the ring design corners in the sealing are avoided. Thereby for instance undesired folding of the sealing in the area of the respective corners can be avoided. Due to the ring design thus in any transverse direction relative to the longitudinal axis a uniform sealing effect between the lens module and the circuit board can be provided by the sealing.

A further embodiment envisages that the sealing in the regions adjoining the predetermined bending point in axial direction is inclined by a respective angle relative to the longitudinal axis. In the two regions adjoining in axial direction this inclination is in particular configured in mutually opposite directions. This means it may be provided that in the region arranged in the direction of the longitudinal axis above the predetermined bending point the sealing is inclined towards the remaining volume space, however in the region arranged in the direction of the longitudinal axis below the predetermined bending point into the opposite direction and thus towards the clearance, which is sealed by the sealing. In this example it is assumed that for each region a subregion is viewed that is arranged at the top in the direction of the longitudinal axis, this means it is viewed how this subregion arranged at the top is oriented in comparison with a subregion of the region which is opposite thereto. In the example this leads to it that the predetermined bending point is arranged closer to the clearance than the regions of the sealing adjoining the predetermined bending point.

It is in particular envisaged that the inclination around the respective angle is present already in the absence of the axial compression. The two regions thus are formed to be inclined independently of the axial compression. The sealing thus is not configured to be in parallel to the longitudinal axis but comprises regions that are arranged inclined and thus at an angle relative to the longitudinal axis. The sealing therefore in case of the axial compression is bent in the regions adjoining the predetermined bending point even further and thus to even larger angles. By the described angled arrangement of the regions the direction into which the sealing is bent at the predetermined bending point when the axial compression is effected is reliably and repeatably predetermined in a fixed manner.

Further an embodiment envisages that the sealing comprises a further predetermined bending point so that the sealing in case of the axial compression is bent transverse to the longitudinal axis at the further predetermined bending point. The sealing is rendered bendable in particular at the two predetermined bending points in mutually opposite directions. This means the sealing is bent in mutually opposite directions in particular at the two predetermined bending points when the axial compression is effected. The further predetermined bending point in particular when viewed in the direction of the longitudinal axis is arranged below the predetermined bending point. By the further predetermined bending point a bending in a transverse direction relative to the longitudinal axis is achieved in the region of the sealing which lies between the two predetermined bending points. Hereby the bending direction of the individual regions of the sealing is predetermined in a particularly reliable manner.

According to an additional embodiment it is envisaged that the further predetermined bending point is configured as a recess in the sealing. The recess in the sealing is in particular arranged on an internal wall of the sealing which faces away from the remaining volume space in the housing. The internal wall faces the clearance that is sealed by the sealing. A narrowing of the width of the sealing in the region of the further predetermined bending point consequently is achieved by a recess being configured in the sealing. In case the sealing is designed as a ring, the recess is for instance a groove in the sealing, which extends across the entire internal wall of the sealing.

It is envisaged that at least the regions of the sealing adjoining the further predetermined bending points have a larger width than the width of the sealing in the region of the further predetermined bending point. The width of the sealing at the further predetermined bending point, however, is larger than the width of the sealing at the predetermined bending point. By the described design of the further predetermined bending point a deformation into a fixed predetermined bending direction of the region between the two predetermined bending points is realized.

Further it is envisaged in an embodiment that the sealing with a first edge directly contacts a top side of the circuit board. The first edge may alternatively be referred to as first end or top edge of the sealing. The top side of the circuit board contacted by the first edge is preferably referred to as flat surface. This means that the surface for instance does not comprise any grooves and/or other recesses or elevations. The flat surface may alternatively be referred to as smooth surface. The first edge in case of the axial compression is also pressed in particular directly to the flat surface of the circuit board. Ultimately, the sealing at one of its edges is in direct contact with the circuit board. Hereby the sealing of the clearance on this side of the clearance is facilitated.

Moreover in an embodiment it is envisaged that the first edge is formed rounded. This means that the first edge may for instance have a semi-circular cross-section. By the rounded design invariably a reliable contact between the first edge and the top side of the circuit board can be achieved, even if the first edge, for instance due to the bending at the predetermined bending point, is moved relative to the surface of the circuit board. This is because the rounded surface of the first edge facilitates a contact surface without any gaps to form between the sealing and the surface of the circuit carrier, which for instance is configured to be flat, in case of a random bending angle of the sealing relative to the direction of the longitudinal direction.

An additional embodiment envisages that the sealing has a second edge. The second edge is arranged opposite the first edge, which means it is on the opposite side of the sealing in comparison with the side of the sealing on which the first edge is arranged. The second edge may alternatively be referred to as second end or bottom end. Moreover, the housing comprises a front housing part, in which the lens module is arranged. The front housing part has a contact surface, which faces the circuit board. In particular the contact surface is configured to radially directly adjoin the lens module. The second edge contacts the contact surface at least indirectly. In other words, the contact surface is a side of the housing facing the sealing, wherein the housing surrounds the lens module, in particular around the opening. In case no further component is arranged on the contact surface, the second edge consequently directly contacts the contact surface. The second edge of the sealing in case of the axial compression can then be pressed directly against the lens module.

In addition to the front housing part a rear housing part may be provided, which for instance is connected to the first housing part and for instance leads to the circuit board being pressed towards the lens module, whereby the axial compression upon the sealing can be generated.

In an additional embodiment it is envisaged that between the contact surface and the second edge the sealing at least partially a temperature control element is arranged. The temperature control element with a side facing away from the second edge of the sealing is arranged for instance directly on the contact surface. The temperature control element is for example configured to heat the lens module and/or the circuit board, in particular up to a predetermined temperature, which lies above freezing. The temperature control element may alternatively be referred to as heating element. Alternatively or additionally, the temperature control element may have a cooling function, which means it may be configured for cooling. Hereby the central components of the camera may be kept at an operating temperature that is beneficial for them. In case the temperature control element is arranged on the contact surface, the sealing with the second edge contacts a surface of the temperature control element that faces the circuit board and thus contacts the contact surface of the lens module only indirectly. Thus, a camera is provided that is independent of ambient temperature.

The contact surface and/or surface of the temperature control element is configured in particular to be flat or smooth, respectively. Thus, there are no grooves and/or differently formed recesses and/or elevations provided.

According to a further embodiment it is envisaged that the sealing is axially compressed between the circuit board, on the one hand, and the contact surface and/or the temperature control element, on the other hand. For instance, to start with, the sealing is positioned on the contact surface and/or the temperature control element and then the circuit board is moved into its predetermined position, for instance by screwing, gluing or otherwise fastening it to the front housing part or a different component of the camera. Hereby a force towards the longitudinal axis is exerted upon the sealing, as a result of which same is bent at the predetermined bending point and, if applicable, to the further predetermined bending point so that ultimately the sealing is realized.

A further embodiment comprises that the sealing at the second edge has at least one bulge extending in the axial direction, which means in the direction of the longitudinal axis. With the at least one bulge the second edge contacts the contact surface and/or the temperature control element. The bulge may alternatively be referred to as protruding subregion or protrusion. An edge of the bulge is in particular rounded. In case the sealing is configured as ring-shaped protrusion of the ring. The bulge has a width that is smaller than a width of the sealing in the region of the sealing adjoining the second edge. In case of the axial compression the sealing in the region of the bulge therefore can be particularly easily deformed and thus the clearance be sealed in a particularly reliable manner.

It may be envisaged that the sealing comprises two bulges arranged spaced apart from each other on the second edge. The bulges are arranged next to each other when viewed transverse to the longitudinal direction. Then two points are provided at which the sealing directly contacts the contact surface and/or the temperature element. This improves the sealing on the second edge even further in comparison with the design comprising only one bulge.

An additional embodiment envisages that the sealing comprises a protrusion. The protrusion extends towards the remaining volume space. The protrusion may be configured as support plate, which is connected to the remaining sealing in a dimensionally stable and in particular non-detachable manner. The protrusion is arranged in such a way that for instance it sits in a ring-shaped manner on the remaining sealing, however it does not protrude into the clearance between lens module and housing, which is sealed by the sealing. This means that the protrusion is arranged on the side of the sealing opposite the internal wall of the sealing. At an edge of the protrusion facing away from the sealing same may for instance be formed cornered. The protrusion in case of the sealing being configured as a ring may form several corners so that the sealing is ring-shaped only at the internal wall and on the opposite side in the region of the protrusion it is cornered, in particular four-cornered. The protrusion extends in the direction of the longitudinal axis only across a part of the sealing. It does not extend across the predetermined bending point. Preferably, the protrusion is arranged in the bottom third of the sealing, viewed in the direction of the longitudinal axis. At least the at least one bulge is arranged in the direction of the longitudinal axis below the protrusion. The two edges of the sealing thus invariably stand out beyond the protrusion in the direction of the longitudinal axis. The protrusion facilitates that the sealing for instance can be easily grasped by a production robot so that it for instance can be automatically precisely positioned in the camera.

It may further be envisaged that in case of two bulges the protrusion is arranged in such a way that the bulges in case of the axial compression are pressed in such a way against the contact surface and/or the temperature control element that no space remains between the protrusion and the contact surface or the temperature control element or the space at least in comparison with the arrangement of the sealing in the absence of the axial compression is reduced.

A further embodiment envisages that the protrusion increases the width of the sealing in a region of the sealing that is spaced apart from the predetermined bending point. A main extension of the protrusion extends in particular transverse, in particular perpendicular, relative to the longitudinal axis. The further predetermined bending point is at least partially arranged in this region of the sealing on a side of the sealing facing away from the protrusion. The side facing away from the protrusion corresponds to the internal wall of the sealing. At least partially thus the further predetermined bending point is arranged at a height of the sealing, at which the protrusion is formed or connected to the remaining sealing, respectively. The width of the sealing in the region in which the protrusion is arranged is consequently preferably maximal compared to the remaining sealing. It may be envisaged that for instance the further predetermined bending point is almost completely located in the region with the protrusion. Preferably, the further predetermined bending point is located at a top edge of the region in the direction of the longitudinal axis, in which the protrusion is arranged. By the protrusion the sealing is stabilized in the bottom part. The wider design there in comparison with the first edge and the predetermined bending point increases the reliability with which the sealing bends at the predetermined bending point in case of the axial compression.

Preferably it is envisaged that the sealing is manufactured from liquid silicone. Liquid silicone may alternatively be referred to as Liquid Silicone Rubber. This material is characterized in that it may be formed to submillimeter precision for instance by injection molding. For this reason it is suitable for manufacturing the sealing, which is for instance in the region of the predetermined bending point only half a millimeter wide. Further, with this material the desired forms, such as for instance the described inclination of the regions of the sealing, the protrusion can be particularly precisely be manufactured as further predetermined bending point and/or the at least one bulge. A different elastic material is possible.

A further aspect of the invention relates to a sealing for a camera. The sealing has a predetermined bending point, at which a width of the sealing transverse to a longitudinal axis of the sealing is minimal in comparison with the width of the sealing in regions of the sealing adjoining the predetermined bending point so that the sealing in case of an axial compression is bendable transverse to the longitudinal axis at the predetermined bending point. The direction of the longitudinal axis of the sealing corresponds to a direction of the longitudinal axis of the camera, if the sealing is installed in a predetermined installation position in the camera.

A further aspect of the invention relates to a motor vehicle comprising a camera as it was described in the above. The motor vehicle is for instance a passenger car, a truck, a bus, a moped, and/or a motorcycle. In the motor vehicle, the camera may be an external camera and/or an internal camera.

Alternatively or additionally, the camera may be associated with a different object or item. This means it is not restricted to applications in an automobile context.

The invention comprises combinations of the described embodiments. The embodiments described in connection with the camera apply accordingly, alone or in combination with each other and as far as applicable, equally to the sealing according to the invention and the motor vehicle according to the invention.

Figure 2:
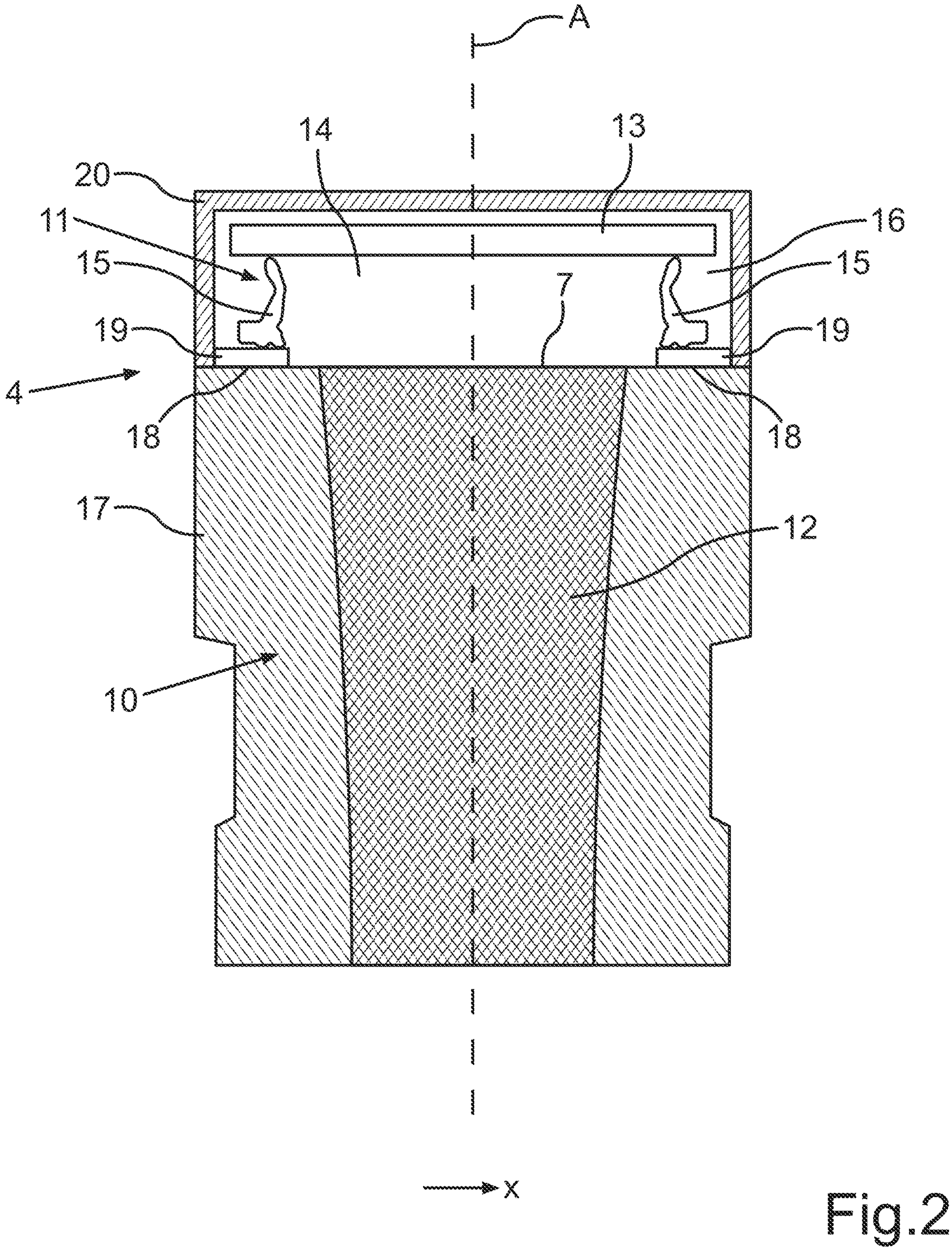
Figure 3:
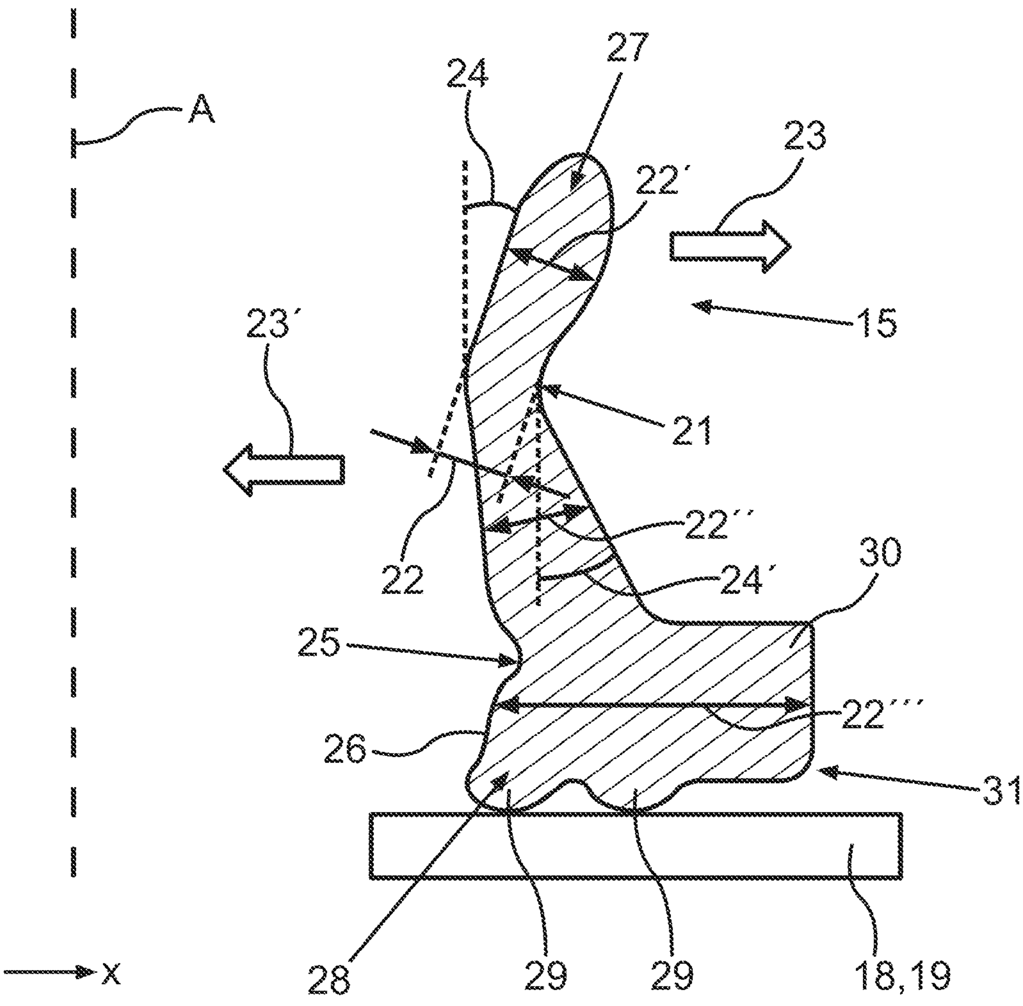
Figure 4:
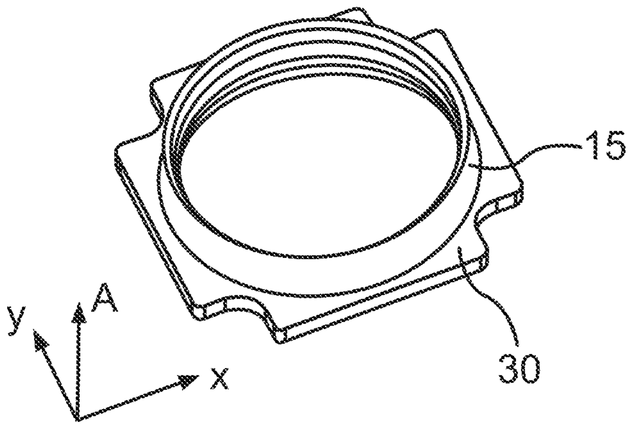
Figure 5:
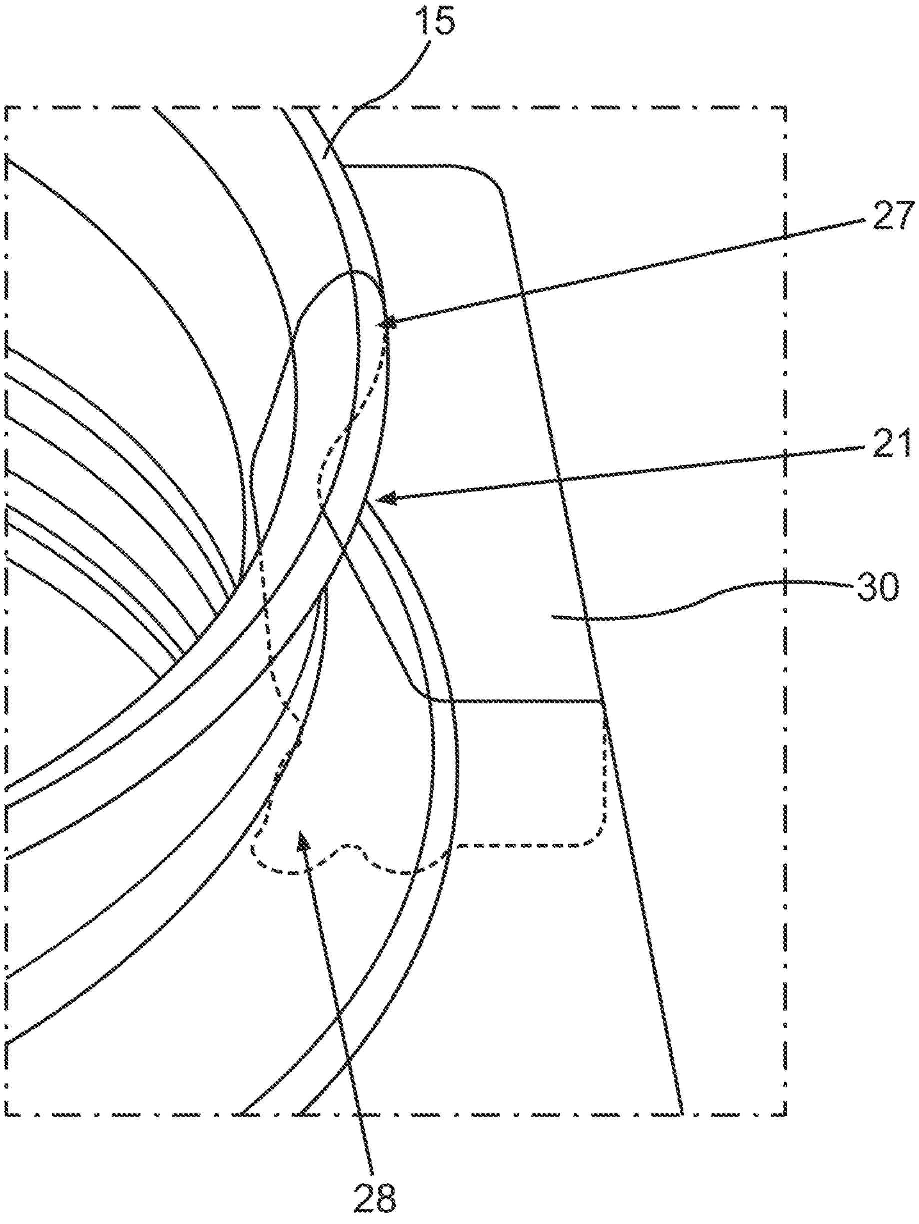

The Drawings Show in:

FIG. 1 a schematic representation of a motor vehicle with several cameras;

FIG. 2 a schematic cross-section of a camera;

FIG. 3 a schematic cross-section through a sealing of a camera;

FIG. 4 a schematic perspective view of a sealing for a camera configured as ring; and FIG. 5 a schematic perspective view of a section of a sealing for a camera.

In the figures same elements or elements having the same function are equipped with the same reference signs.

In FIG. 1 a motor vehicle 1 is sketched. The motor vehicle 1 comprises a control device 2, by which for instance a driver assistance system 3 for the motor vehicle 1 can be provided. The motor vehicle 1 comprises several cameras 4. Data captured by the respective camera 4, which may for instance be referred to as sensor information or camera image, are for instance provided to the control device 2. The driver assistance system 3 may for instance control the motor vehicle 1 at least partially automatically in consideration of these data.

One of the cameras 4 here is configured for capturing the environment of the motor vehicle 1 in a front portion of the motor vehicle 1. This means this camera 4 is a front camera. The front camera here is arranged in a height direction of the motor vehicle 1 on a top portion of a windscreen 5 of the motor vehicle 1. Further, in a rear area of the motor vehicle 1 a further camera 4 may be arranged, which for instance may be referred to as rear camera. Moreover or alternatively, at least one camera 4 may be arranged in a side mirror 6 of the motor vehicle 1. This camera 4 then is a side camera of the motor vehicle 1. On the whole, by the for instance four described cameras 4 a complete environment of the motor vehicle 1 may be captured. Further, a camera 4 may be provided, which is arranged in an interior of the motor vehicle 1, and for instance is configured to capture a driver and/or co-driver of the motor vehicle 1. An arrangement of the cameras 4 in and/or on the motor vehicle 1 may be chosen randomly and here is sketched purely exemplarily.

FIG. 2 shows a cross-section through one of the cameras 4. The camera 4 comprises a housing 10, wherein by the housing 10 a receiving space 11 is bounded, in which a lens module 12 of the camera 4 and a circuit board 13 of the camera 4 are arranged. The circuit board 13 and the lens module 12 are arranged in the direction of the longitudinal axis A of the camera 4 axially spaced apart from each other so that between the circuit board 13 and the lens module 12 a clearance 14 is formed. The clearance 14 is a subregion of the receiving space 11. Between the circuit board 13 and the lens module 12 an elastic sealing 15 is arranged so that the clearance 14 is sealed by the sealing 15 from a remaining volume space 16 in the housing 10. Ultimately, by the sealing 15 the receiving space 11 is subdivided into the clearance 14 and the remaining volume space 16. The clearance 14 here represents a optical path for light captured by the lens module 12 and emitted towards the circuit board 13. The light for instance enters the clearance 14 through an exit portion 7 of the lens module 12. The exit portion 7 may be referred to as opening of the lens module 12. The light may for instance impinge upon a sensor or detector arranged on a side of the circuit board 13 which faces the lens module 12. The circuit board 13 may alternatively be referred to as printed circuit board.

The housing 10 here comprises a front housing part 17 and a rear housing part 20. These are for instance connected with each other at contact points by screws, rivets, glue, or any other kind of connection technique. In the front housing part 17 here the lens module 12 is arranged. The front housing part 17 of the housing 10 may comprise a contact surface 18. The contact surface 18 is a surface of the front housing part 17, which faces the sealing 15 and the circuit board 13. In particular the contact surface 18 is arranged adjoining radially directly the lens module 12. The lens module 12 is preferably configured to be formed at least partially rounded. At least parts of the housing 10 may be configured to be cuboidal.

On the contact surface 18 a temperature control element 19 of the camera 4 may be arranged. The temperature control element 19 is arranged in the direction of the longitudinal axis A above the contact surface 18. By the temperature control element 19 for instance a predetermined temperature for the lens module 12 and/or the circuit board 13 may be set, in particular at temperatures in the camera 4 which for instance lie below freezing. The temperature control element 19 may be configured as heating element. The sealing 15 may be axially compressed between the circuit board 13, on the one hand, and the contact surface 18 and/or the temperature control element 19, on the other hand.

FIG. 3 shows a cross-section through the sealing 15. The sealing 15 is for instance manufactured from liquid silicone. The sealing 15 comprises a predetermined bending point 21. This may be arranged centrally or in a top half of the sealing 15 in the direction of the longitudinal axis A. In the region of the predetermined bending point 21 a width 22 of the sealing 15 is minimal in comparison to a width 22', 22" of the sealing 15 in regions of the sealing 15 adjoining the predetermined bending point 21 so that the sealing 15 in case of an axial compression is bent transverse to the longitudinal axis A at the predetermined bending point 21. The width 22 may for instance be 0.5 millimeter wide. By contrast, the widths 22', 22" are larger, for instance larger than 0.5 millimeter and 0.6 millimeter or in particular 0.7 millimeter.

Further the sealing 15 in the regions adjoining the predetermined bending point 21 in axial direction may be inclined or kinked by a respective angle 24, 24' relative to the longitudinal axis A. For instance the angle 24 in the region above the predetermined bending point 21 amounts to about 20° between the longitudinal axis A and an internal wall 26 of the sealing 15. The region arranged above the predetermined bending point 21 here is inclined in the opposite direction compared to a region arranged below the predetermined bending point 21. There for instance the angle 24' between the longitudinal axis A and a wall of the sealing 15 opposite the internal wall 26 amounts to about 27°. These angles 24, 24' are to be understood purely exemplary. Larger and/or smaller angles 24, 24' are possible.

If a compression is exerted upon the sealing 15 in axial direction, which means in the direction of the longitudinal axis A, that is if for instance a force acts from above or from below against the sealing 15, same is bent at a first edge 27 in a bending direction 23. This results here from the design of the predetermined bending point 21 as well as the angles 24, 24'.

A further predetermined bending point 25 may be provided so that the sealing 15 in case of the axial compression is bent at the further predetermined bending point 25 transverse to the longitudinal axis A, wherein the sealing 15 is bent at the two predetermined bending points 21, 25 in mutually opposite directions. The bottom region in case of the axial compression is bent into a bending direction 23' which is opposite to the bending direction 23. The further predetermined bending point 25 is in particular configured as recess in the sealing 15. The same is arranged on an internal wall 26 of the sealing 15, wherein the internal wall 26 in case of an installation of the sealing 15 into the camera 4 faces the clearance 14 and thus faces away from the remaining volume space 16.

The sealing 15 at a second edge 28 has at least one bulge 29. The sealing 15 shown here comprises two bulges 29. With the at least one bulge 29 the sealing 15 may directly contact the contact surface 18 and/or the temperature control element 19. In the case of the two bulges 29 these are arranged adjacent to one another in a transverse direction relative to the longitudinal axis A. Moreover, they are arranged spaced apart from each other in this direction.

The sealing 15 may comprise a protrusion 30. The protrusion 30 may in particular be configured as dimensionally stable, ring-shaped carrier board. The protrusion 30 may in particular be arranged in a non-detachable manner on the remaining sealing 15. The two edges 27, 28 stand out at least beyond the protrusion 30. The protrusion 30 extends towards the remaining volume space. It is consequently not arranged on the internal wall 26 of the sealing 15. A width 22" of the sealing 15 in the region of the protrusion 30 corresponds here to a maximum width 22, 21', 22", 22'" of the sealing 15. The further predetermined bending point 25 is at least partially arranged in a region of the sealing 15, in which the protrusion 30 is arranged. This region is here a subregion 31.

The first edge 27 of the sealing 15 may be formed rounded. With the rounded first edge 27 the sealing 15 in its installed position contacts the circuit board 13. A recess in the circuit board 13 for receiving the top edge 27 of the sealing 15 is in particular not provided.

In FIG. 4 a perspective representation of the sealing 15 is shown. The same is configured as a ring. The protrusion 30 is configured in such a way that transverse to the longitudinal axis A it is square, however, here it has recesses instead of corners. These serve for instance as space, in which connection elements between for instance the circuit board 13 and the lens module 12 may be positioned. The protrusion 30 serves for instance for rendering the sealing 15 capable of being grasped by a robot, in particular an industrial robot, and/or manually. The camera 4 may thus be assembled automatically, wherein the sealing 15 may automatically be positioned for instance on the temperature control element 19 and/or directly on the contact surface 18.

FIG. 5 shows a section of the sealing 15 configured as ring with the protrusion 30. Herein the cross-section of the sealing 15 is schematically emphasized. The regions of the sealing 15 arranged below the surface of the sealing 15 are sketched with dashed lines. Here this concerns the region of the second edge 28 and the bulges 29 arranged there.

Overall, the examples show a cross-sectional geometry for the sealing 15 of the camera 4. This facilitates a sealing with little force required, in order to keep impurities and scattered light from entering the optical path (optical path) of the camera 4. The main feature of the invention is the predetermined bending point 21. The predetermined bending point 21 has a reduced cross-sectional thickness of the material approximately in the center of the sealing 15. It allows for the sealing 15 to be bent at this point, wherein a direction of the deformation and thus of the bending is controlled. By the predetermined bending point 21 a uniform compression is ensured. Moreover, location flanges were added, such as for example the two bulges 29, in order to allow for a better contact with the remaining housing 10, that is here with the contact surface 18 and/or the temperature control element 19.

The invention claimed is:

1. A camera for a motor vehicle,
wherein the camera comprises a housing,
wherein a receiving space is bounded by the housing,
wherein a lens module of the camera and a circuit board of the camera are arranged in the receiving space,
wherein the circuit board and the lens module are arranged axially spaced apart from each other in the direction of a longitudinal axis of the camera so that between the circuit board and the lens module a clearance is formed,
wherein between the circuit board and the lens module an elastic sealing is arranged so that the clearance is sealed, by the sealing, from the remaining volume space in the housing,
wherein the sealing comprises a predetermined bending point, at which a width of the sealing transverse to the longitudinal axis is minimal in comparison with the width of the sealing in regions of the sealing adjoining the predetermined bending point so that in case of an axial compression, the sealing is bent transverse to the longitudinal axis at the predetermined bending point.

2. The camera according to claim 1,
wherein the sealing is a ring.

3. The camera according to claim 1,
wherein, in the regions adjoining the predetermined bending point, the sealing is inclined by a respective angle relative to the longitudinal axis in mutually opposite directions, without the axial compression.

4. The camera according to claim 1,
wherein the sealing comprises a further predetermined bending point so that the sealing, in case of the axial compression, is bent transverse to the longitudinal axis at the further predetermined bending point,
wherein the sealing, at the two predetermined bending points, is bent in mutually opposite directions.

5. The camera according to claim 4,
wherein the further predetermined bending point is configured as a recess in the sealing arranged on an internal wall of the sealing, which faces away from the remaining volume space in the housing.

6. The camera according to claim 1,
wherein the sealing, with a first edge, directly contacts a top side of the circuit board.

7. The camera according to claim 6,
wherein the first edge is rounded.

8. The camera according to claim 6,
wherein the sealing comprises a second edge and the housing comprises a front housing part, wherein the lens module is arranged in the front housing part,
wherein the front housing part comprises a contact surface, which faces the circuit board and directly adjoins the lens module, and the second edge directly contacts the contact surface.

9. The camera according to claim 8,
wherein a temperature control element is arranged at least partially between the contact surface and the second edge of the sealing.

10. The camera according to claim 9,
wherein the sealing is arranged axially compressed between the circuit board, and the contact surface or the temperature control element.

11. The camera according to claim 9,
wherein the sealing comprises a bulge at the second edge,
wherein the bulge extends in the axial direction,
wherein the second edge contacts the contact surface or the temperature control element with the bulge.

12. The camera according to claim 8,
wherein the sealing comprises a protrusion, which extends towards the remaining volume space,
wherein at least the two edges each stand out in axial direction beyond the protrusion,
wherein the protrusion is connected to the remaining sealing in a dimensionally stable manner.

13. The camera according to claim 12,
wherein the protrusion increases the width of the sealing in a region of the sealing spaced apart from the predetermined bending point and the further predetermined bending point is arranged at least partially in the protrusion region of the sealing, on a side of the sealing which faces away from the protrusion.

14. A sealing for a camera, comprising:
a predetermined bending point, at which a width of the sealing transverse to a direction of a longitudinal axis of the sealing is minimal in comparison with a width of the sealing in regions of the sealing adjoining the predetermined bending point so that the sealing in case of an axial compression is bendable transverse to the longitudinal axis at the predetermined bending point.

15. A motor vehicle comprising a camera of claim 14.

* * * * *